United States Patent [19]

Krivokapic

[11] Patent Number: 5,559,357
[45] Date of Patent: Sep. 24, 1996

[54] POLY LDD SELF-ALIGNED CHANNEL TRANSISTORS

[76] Inventor: Zoran Krivokapic, 2321 De Varona Pl., Santa Clara, Calif. 95050

[21] Appl. No.: 449,619

[22] Filed: May 24, 1995

Related U.S. Application Data

[60] Division of Ser. No. 369,766, Jan. 6, 1995, which is a continuation-in-part of Ser. No. 948,365, Sep. 21, 1992, abandoned.

[51] Int. Cl.$^6$ .................................................. H01L 27/108
[52] U.S. Cl. ........................ 257/336; 257/344; 257/408; 257/333; 257/396; 257/377; 257/900
[58] Field of Search ............................. 257/408, 412, 257/413, 411, 344, 336, 900, 396, 345, 377, 371, 374, 389, 395, 379, 333

[56] References Cited

U.S. PATENT DOCUMENTS

| | | | |
|---|---|---|---|
| 4,513,494 | 4/1985 | Batra | 29/576 B |
| 4,697,198 | 9/1987 | Komori et al. | 357/23.3 |
| 4,974,055 | 11/1990 | Haskell | 357/71 |
| 4,977,108 | 12/1990 | Haskell | 437/229 |
| 5,045,901 | 9/1991 | Komori et al. | 357/23.4 |

FOREIGN PATENT DOCUMENTS

| | | | |
|---|---|---|---|
| 61-187273 | 8/1986 | Japan | 257/408 |

OTHER PUBLICATIONS

A. F. Tasch et al, "Limitations of LDD Types of Structures in Deep–Submicrometer MOS Technology", *IEEE Electron Device Letters*, Vo. 11, No. 11, pp. 517–519 (Nov. 1990).

R. Izawa et al, "Impact of the Gate–Drain Overlapped Device (GOLD) for Deep Submicrometer VLSI", *IEEE Transactions on Electron Devices*, vol. 35, No. 12, pp. 2088–2093 (Dec. 1988).

D. S. Wen et al, "A Fully Planarized 0.25 μm CMOS Technology", *Digest of 1991 Symposium on VLSI Technology*, pp. 83–84.

K. Hieda et al, "Sub–Half Micrometer Concave MOSFET with Double LDD Structure", *IEEE Transactions on Electron Devices*, vol. 39, No. 3, pp. 671–676 (Mar. 1992).

*Primary Examiner*—William Mintel
*Attorney, Agent, or Firm*—Benman Collins & Sawyer

[57] ABSTRACT

Short channel MOS devices are provided with two distinct doped polysilicon contacts: (a) doped polysilicon layers in contact with the source or drain regions (the LDD regions) and extending underneath the oxide region to abut the oxide liner of the trench sidewalls; and (b) polysilicon source and drain contacts in contact with the doped polysilicon layers. The shallow channel doping region is self-aligned with the lightly doped source and drain regions; this ensures vertically engineered profiles that give high punchthrough voltages and an excellent short channel control. The use of the doped polysilicon layers ensures self-alignment of source/drain diffusions and channel and prevents etching of TEOS in the trenches, which prevents exposure of trench sidewalls and formation of parasitic devices in the sidewalls. Further, use of doped polysilicon layers to form the LDD regions by diffusion results in high currents and shallow junctions. The devices also include an insulation spacer that separates the gate electrode from the oxide region between the source and drain contacts and the gate electrode, the insulation spacer preferably made of a nitride. To relieve stress, a thin oxide layer is provided between the insulation spacer and the oxide region. The insulation spacers increase drive currents and move the peak electric field under the spacers, thereby improving device reliability. The insulation spacers also make it possible to define effective channel lengths, thereby avoiding the use of advanced lithography.

9 Claims, 7 Drawing Sheets

FIG. 4A
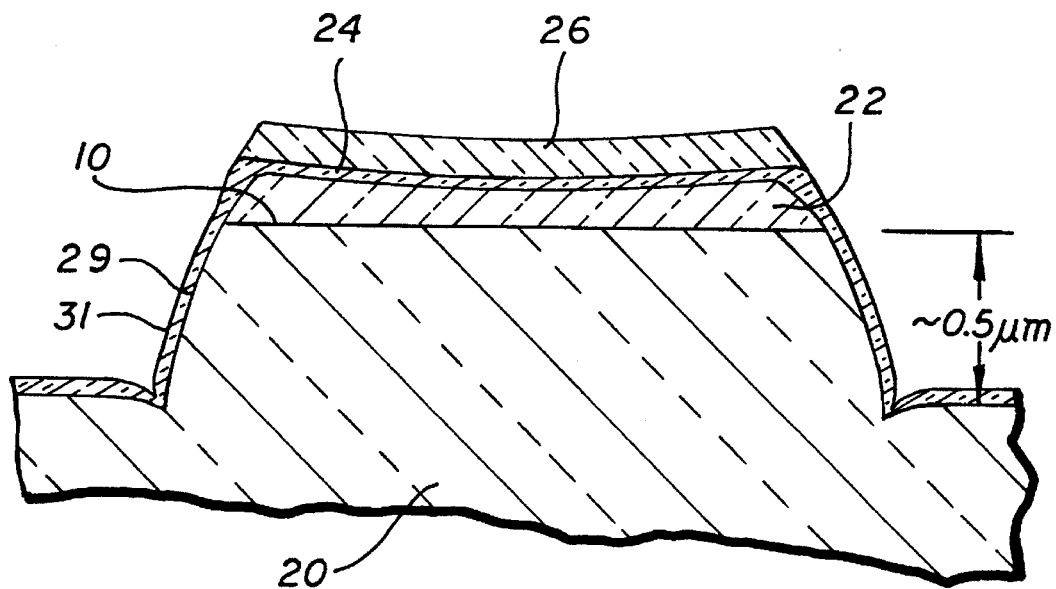
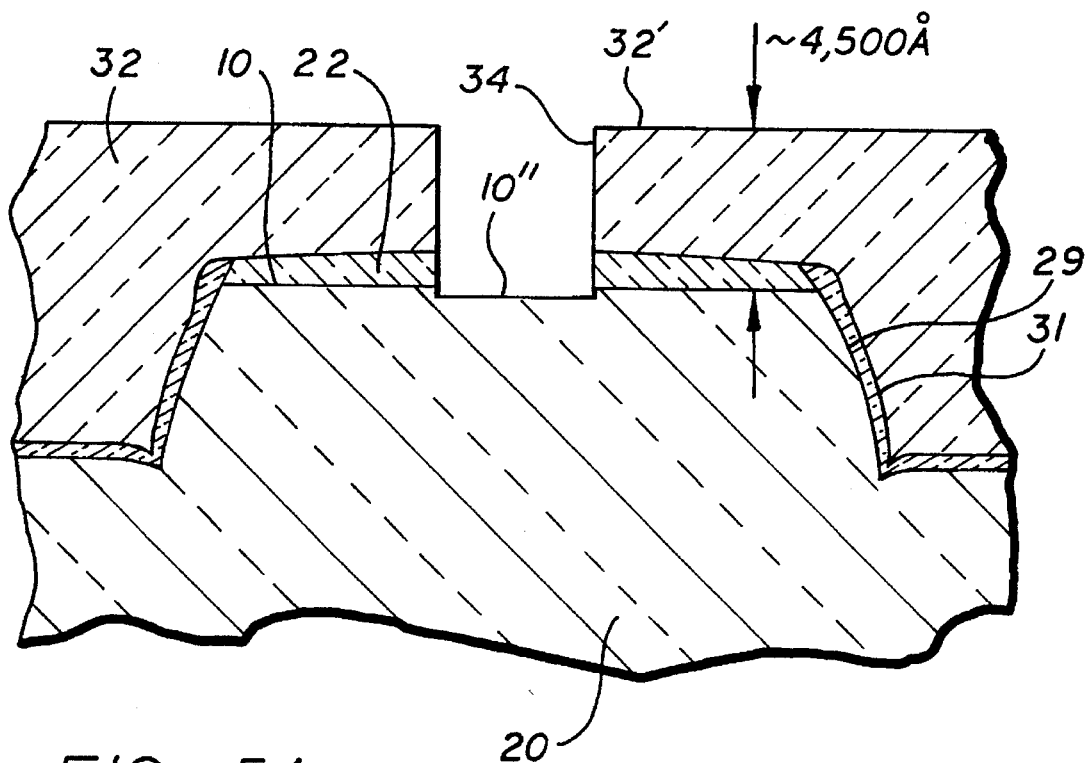
FIG. 5A

FIG. 6B
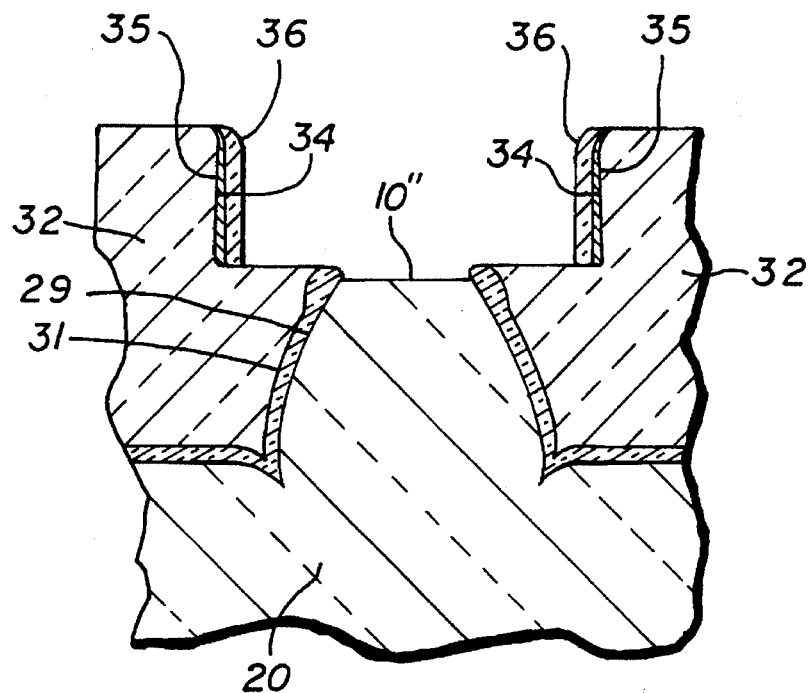
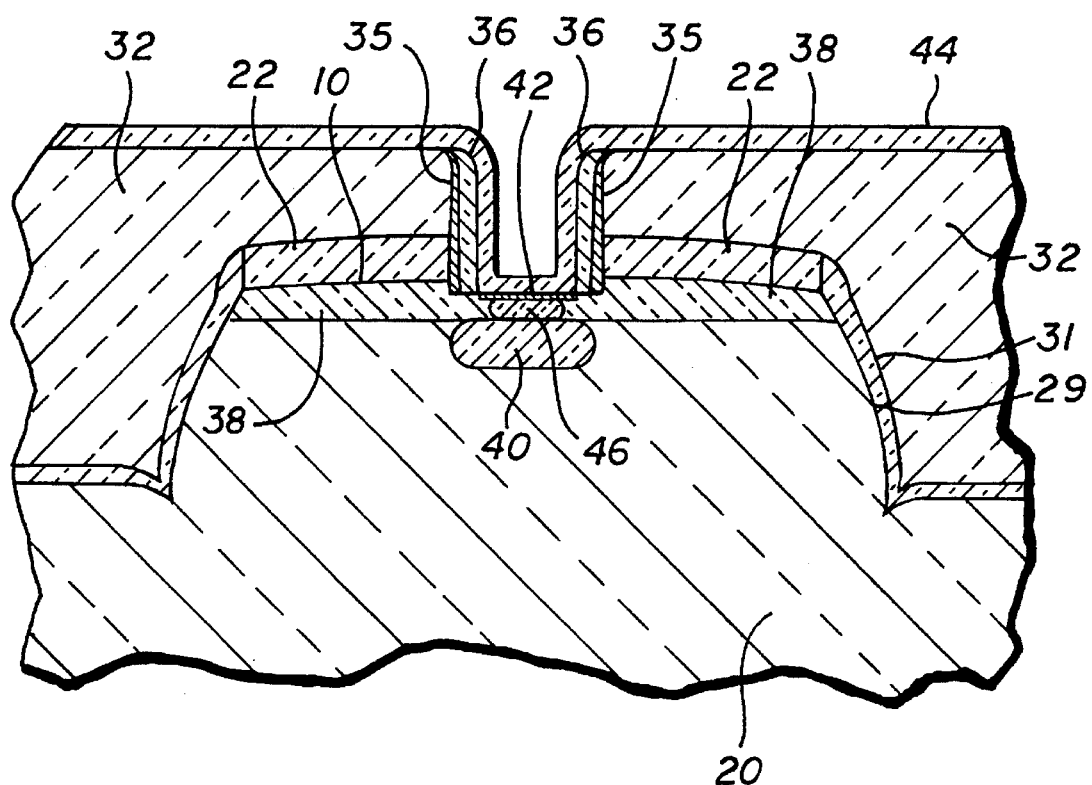
FIG. 7A

FIG. 7B
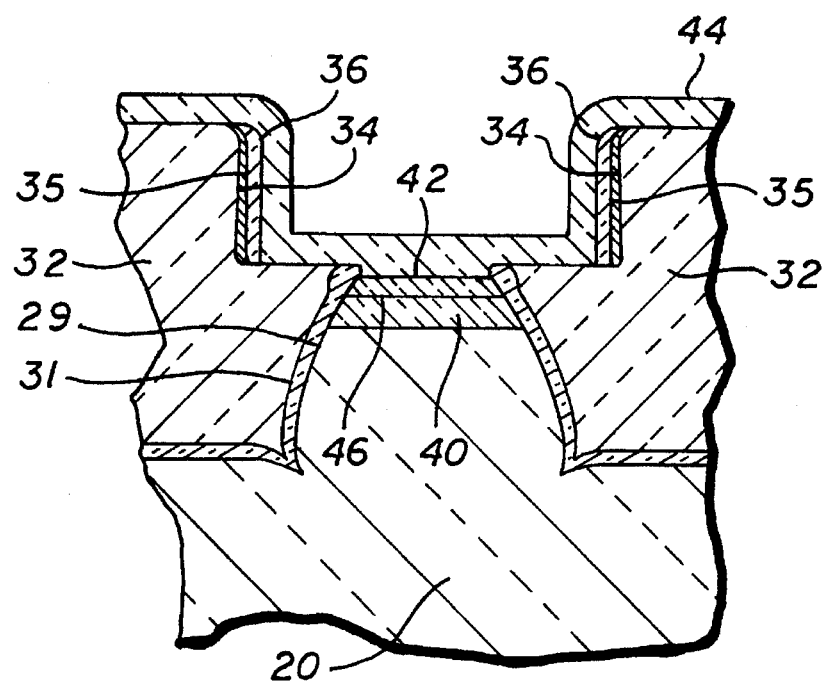
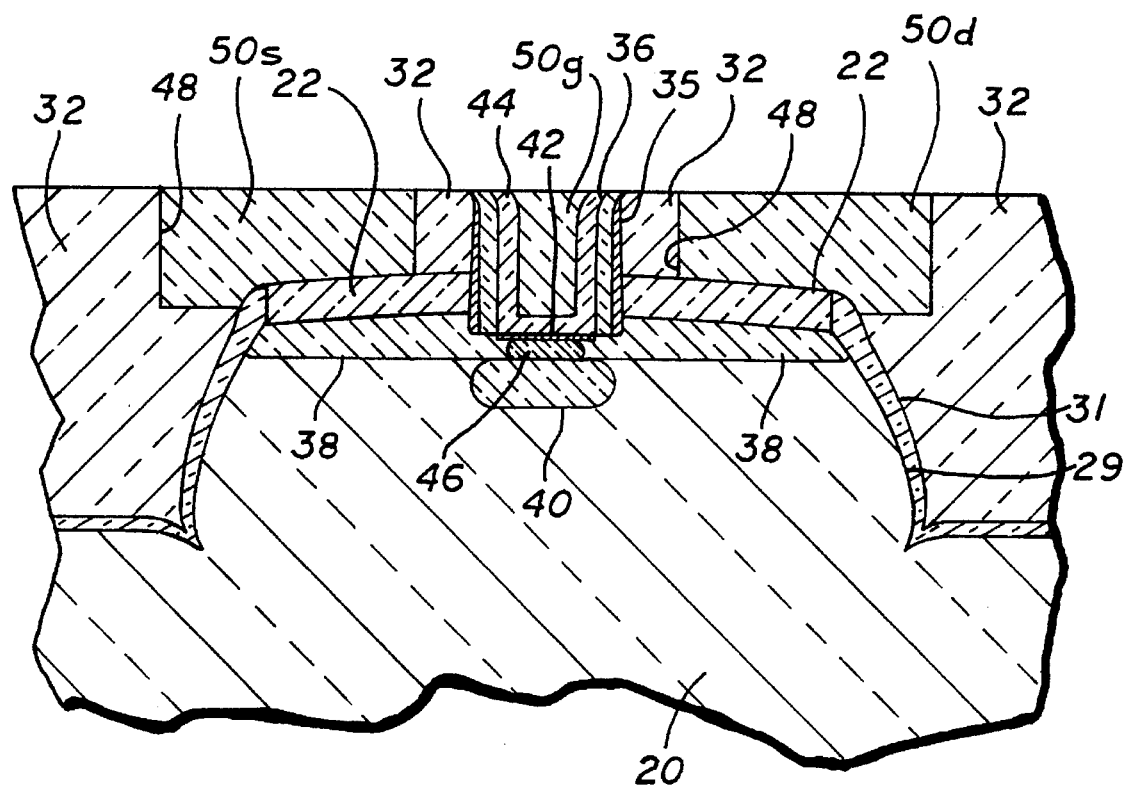
FIG. 8A

FIG. 8B
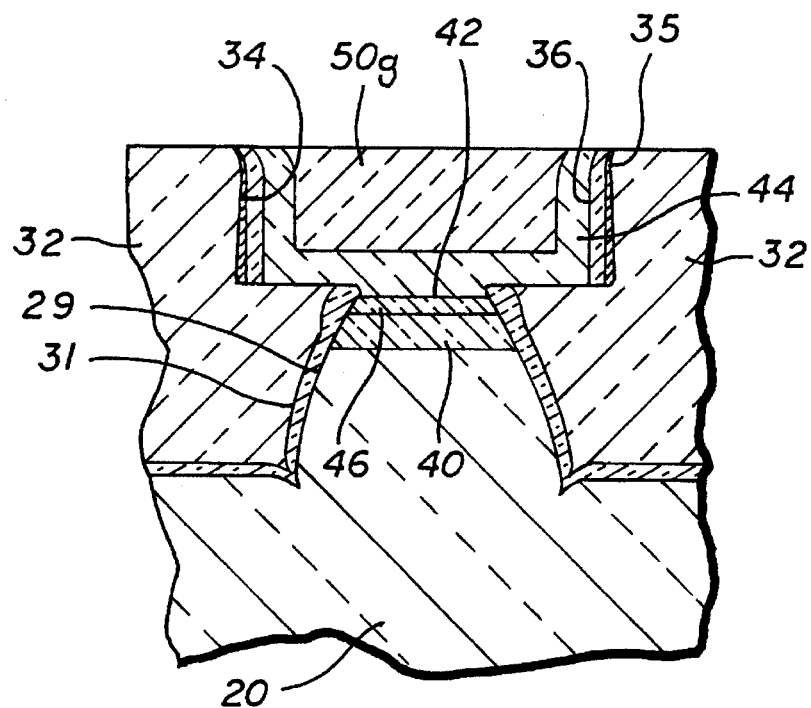
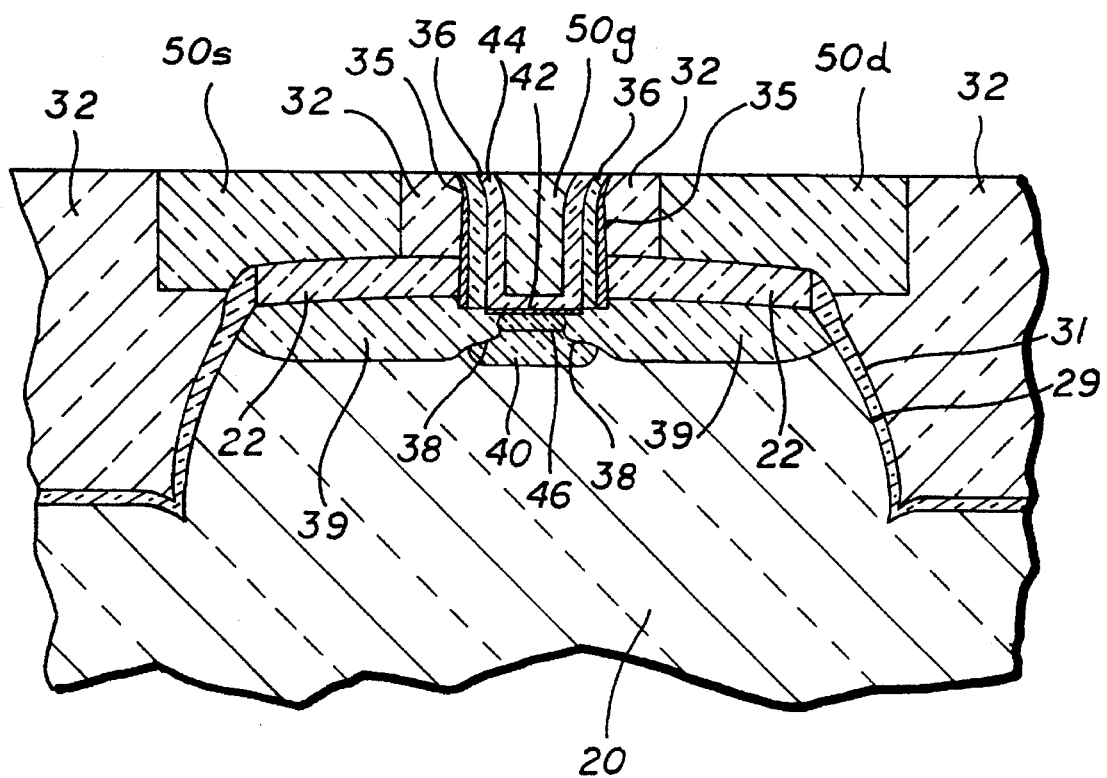
FIG. 9A

POLY LDD SELF-ALIGNED CHANNEL TRANSISTORS

This is a division of application Ser. No. 08/369,766 filed Jan. 6, 1995, which in turn is a continuation-in-part of application Ser. No. 07/948,365, filed Sep. 21, 1992, now abandoned.

TECHNICAL FIELD

The present invention relates to metal oxide semiconductor (MOS) transistors, and, more particularly, to methods for scaling complementary (CMOS) transistors into the deep sub-micrometer range. Specifically, the present invention relates to an improved process for the fabrication of lightly-doped drain (LDD) transistors.

BACKGROUND ART

Attempts continue to shrink the dimensions for fabricating MOS transistors. Devices having sub-micrometer dimensions permit closer placement of devices, thereby increasing the density of devices on a chip and also increasing device operating speed.

There are many types of lightly-doped drain (LDD) transistors presently in use, which are reviewed by A. F. Tasch et at, IEEE Electron Device Letters, Vol. 11, No. 11, pp. 517–519 (1990). In order to reduce the dimensions even further, based on device simulations, it appears that the scaled device must have shallow N⁻ LDD junctions to overcome charge sharing and doping compensation effects. This permits devices with acceptable short channel threshold and drain induced barrier lowering (DIBL) effects. However, when the peak N⁻ doping level is increased high enough for acceptable on-resistance, the drain field increases, giving rise to unacceptably high substrate and gate currents.

The so-called GOLD (gate overlapped drain) transistor, described by K. Izawa et al, IEEE Transactions on Electron Devices, Vol. 35, pp. 2088–2093 (1988) overcomes the N⁻ resistance problem by inducing a channel in the LDD regions with the overlapping gate. This comes at the expense of lower packing density and large Miller capacitance.

The short channel metal-oxide semiconductor devices are separated from neighboring devices by a trench whose sidewalls are lined with an oxide liner, such as by steam oxidation. The trench is then filled with an oxide filler, such as by TEOS (tetra-ethyl orthosilicate). Each device comprises (a) lightly doped source and drain regions having a first conductivity separated by a gate region, (b)) a shallow channel doping region having a second conductivity opposite to the first conductivity and formed in the gate region, (c) doped polysilicon contacts contacting each of the source and drain regions, (d) a gate oxide formed over the gate region, and (e) a gate electrode comprising polysilicon having the first conductivity, the gate electrode separated from the source and drain contacts by an oxide.

This basic trench configuration of short channel metal-oxide semiconductor devices enables industry to achieve reduced dimensions in MOS transistor technology. However, enthusiasm in the semiconductor industry for this configuration has been dampened by problems deriving from the formation of parasitic devices in the trench sidewalls as well as low drive currents. More specifically, in performing etching processes necessary to manufacture such MOS devices, it is possible to etch the TEOS layer into the trench, so that the trench sidewalls are exposed. As a result, this exposed Si surface forms part of the gate region and causes (1) degraded carrier mobility in the mechanically-stressed curved region with lower saturation current; and (2) an accumulation of dopant near the exposed surface which remits in spatial variations of threshold voltage.

Accordingly, there remains a need for improving drive currents, eliminating sidewall trench parasitics, and simplifying trench filling TEOS polishing in CMOS transistors having sub-micrometer channel lengths.

DISCLOSURE OF INVENTION

In accordance with the invention, short channel MOS devices are provided with doped polysilicon ("poly") layers atop and in contact with the source and drain regions. The doped poly layers extend underneath the oxide region separating the source and drain contacts from the gate electrode as well as underneath the source and drain contacts themselves, with one end of the doped poly layers abutting the oxide liners of the trench sidewalls. The doped poly layers prevent the oxide filler (e.g., TEOS) present in the trenches of the MOS device from being overetched to the point of exposing the trench sidewalls in subsequent etching operations carded out in the manufacture of the MOS device. Accordingly, the doped poly layers of the present invention prevent the formation of parasitic devices in the sidewalls.

The method for constructing the MOS devices of the invention includes the following steps:

(a) layering the top of the source and drain regions of the FET with a first poly layer, (b) creating the trench having sidewalls around the source and drain regions by etching into the underlying Si and exposing the edge of the first poly layer without removing the first poly layer overtop the source and drain region;

(c) oxidizing the sidewalls of the trench including oxidizing the exposed edge of the first poly layer to form an isolation oxide liner around the periphery of the active region including the source and drain regions, the first poly layer and the trench sidewall having an intersection;

(d) depositing an oxide layer over top of the silicon substrate;

(e) planarizing the substrate;

(f) depositing resist on the substrate and exposing the resist to electromagnetic radiation to pattern the wafer for source and drain contacts and for the gate region; and (g) etching the oxide layer to form the source and drain contact holes and gate openings while maintaining intact the first poly layer and the oxide finer in the vicinity of the intersection.

In addition to employing doped poly layers, an insulation spacer is employed in the practice of the invention that separates the gate electrode from the oxide between the source and drain contacts and the gate electrode. The insulation spacers, together with the doped polysilicon layers, increase the drive currents attainable in MOS devices, among other advantages discussed more fully below.

The configuration of the present invention ensures that the shallow implant is self-aligned with the source and drain regions. As a consequence, vertically engineered profiles that give high punch-through voltages and an excellent short channel control are achieved. The use of the doped polysilicon layers (contacting the LDD regions) also ensures self-alignment of source/drain diffusions and channel and prevents etching of TEOS in the trenches, which prevents exposing of trench sidewalls. Further, use of the polysilicon to form the LDD regions remits in high currents and shallow junctions.

The insulation spacers of the present invention increase drive currents and move the peak electric field under the spacers, thereby reducing the electric field under the oxide, which is expected to improve device reliability. The insulation spacers also make it possible to define effective channel lengths, thereby avoiding the use of advanced lithography.

The present invention provides a lower cost device structure, with simplified manufacturing steps and improved reliability. Further, the present invention allows device characteristics otherwise obtainable only by next generation manufacturing equipment.

Drive currents are increased by a factor of about 100 to 150% over prior art structures for a channel length of 0.5 mm. Further, gate electrode extension into the trench is completely eliminated for this class of devices. Finally, there is no step between p- and n-channel devices, which makes planarization easier.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 2A–9A are cross-sectional views depicting the structure of the device at various stages in the process of the invention, taken along line 1A—1A' of FIG. 1;

FIGS. 5B–8B are cross-sectional views depicting the structure of the device at various stages in the process of the invention, taken along line 1B—1B' of FIG. 1.

BEST MODES FOR CARRYING OUT THE INVENTION

Figure 1:
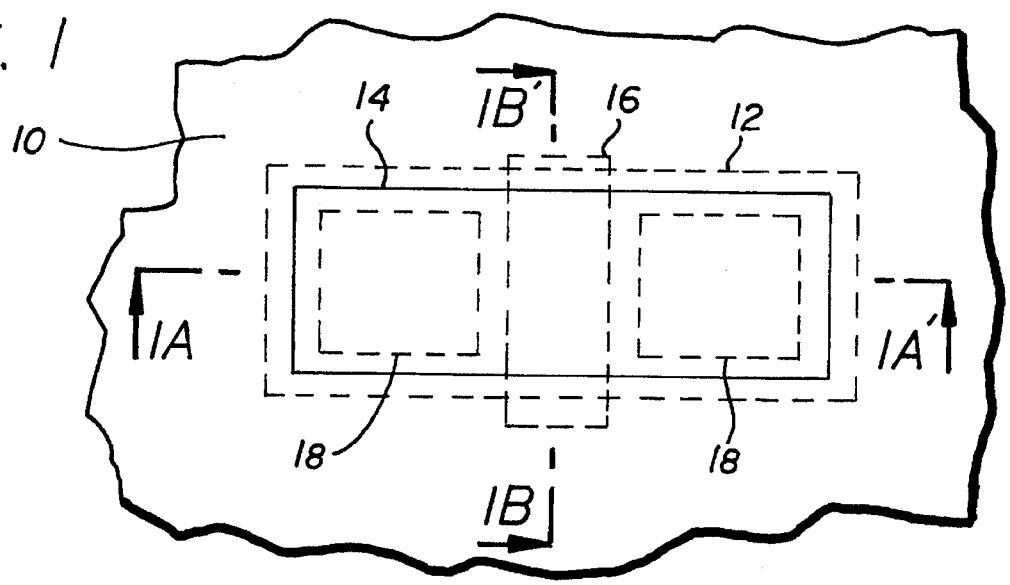
FIG. 1 is a top plan view of the series of masks utilized at various stages in the process of the invention.

Reference is now made in detail to a specific embodiment of the present invention, which illustrates the best mode presently contemplated by the inventor for practicing the invention. Alternative embodiments are also briefly described as applicable.

The present invention is directed to the formation of trench-isolated FET devices having LDD serf-aligned channel transistors employing ion-implanted polysilicon ("poly") for doping the regions which will become the LDD regions of the FET. For making a CMOS circuit, after p- and n-well formation, a polysilicon layer is deposited. This poly layer is deposited to a thickness of about 100 to 250 nm, preferably about 200 nm.

This poly layer is used to make the LDD structures by p-LDD and n-LDD masking steps and subsequent ion implants. Implant energies are low so the dopants will not penetrate into silicon, but energies must be high enough for the dopants to penetrate through the oxide/nitride layer on top of the poly layer. For boron implant, the energy ranges from about 40 to 80 keV, while for phosphorus implant, the energy ranges from about 80 to 160 keV.

Next, isolation trenches are formed to isolate the active device region including the polylayer thereon. Then the trench sidewalls are oxidized by a conventional wet, low temperature ($T \leq 800°$ C.) process. Dopants from the polysilicon layer will not diffuse deeper than about 0.05 mm, due to the low processing temperature. Next, the trenches are filled by furnace tetra-ethyl orthosilicate (TEOS) and then polished (as described in U.S. Pat. Nos. 4,974,055 and 4,977,108, issued to Jacob D. Haskell and assigned to the same assignee as the present application).

Gate masks open an 0.5 mm wide hole in the TEOS layer. Polysilicon is then removed from the gate region and an overetch into underlying silicon is performed to get rid of unwanted dopants. The gate trench is much shallower than, for example, that disclosed by D. S. Wen et al, Digest of 1991 Symposium on VLSI Technology, pp. 83614 84, which allows higher drive currents. Next, spacers, TEOS, and nitride layers are deposited. Punchthrough stop implant is performed, using well masks. After an anisotropic etch, leaving >>0.05 mm wide spacers, a grow-deposit-grow gate oxide (about 9 to 10 nm thick) is grown; and threshold adjust implant is performed through 0.075 mm polysilicon layer, deposited on top of the gate oxide. Next, a mask opens sources and drains (using a poly etch, followed by nitride and oxide etch). Due to a possible misalignment between gate and this mask, the distance of the source contact to the gate can be different than that of the drain contact to the gate. In the worst case, assuming critical dimension variations of 0.08 mm and mis-alignment of 0.1 mm, drive currents measured at both source and drain electrodes vary by $\leq 10\%$, which corresponds for 0.5 mm technology to an 0.02 mm variation in gate critical dimension or 0.01 mm variation in gate trench.

The next step is to deposit a thick layer of polysilicon and planarize it by polishing. Using $n^+$ and $p^+$ masks, polysilicon is doped by phosphorus and boron, respectively.

Because of the way by which my process is carried out, my LDD regions avoid formation of parasitic devices in the trench sidewalls and other mobility reduction and threshold variation problems brought about by mechanical stress induced problems at the prior art curved exposed active area at the region at the contact edge between the trench and the top surface of the source and drain region. The same polysilicon layers also enable obtaining of much higher drain drive currents than by a conventional, connector technology. Drive currents obtained from device simulations (PISCES 2B) were about 800 mA/mm (n-channel) and 350 mA/mm (p-channel) for a nominal gate mask critical dimension of 0.5 mm. The punchthrough stop implant step also guarantees a very good control over drain-induced barrier lowering (DIBL) and punchthrough currents, and also gives solid short channel control.

Computer simulations (process and device) for manufacturability (taking into account all major process variations according to the capabilities of present equipment) were performed. The results are set forth in greater detail below. Particulars of the process now follow.

FIG. 1 is a plan view of the series of masks utilized at various stages in the process of making a CMOS pair of transistors according to the invention. These masks, which are used on the surface 10 of a semiconductor wafer, include an LDD mask 12, a trench mask 14, a gate mask 16, and a source/drain mask 18. FIGS. 2A–9A are cross-sectional views, taken along 1A—1A' of FIG. 1, while FIGS. 5B–8B are cross-sectional views, taken along 1B—1B' of FIG. 1. An absent "B" Figure indicates that either this view is identical to the "A" Figure or nothing essential was done along 1B—1B' from the previous Figure.

Figure 2A:
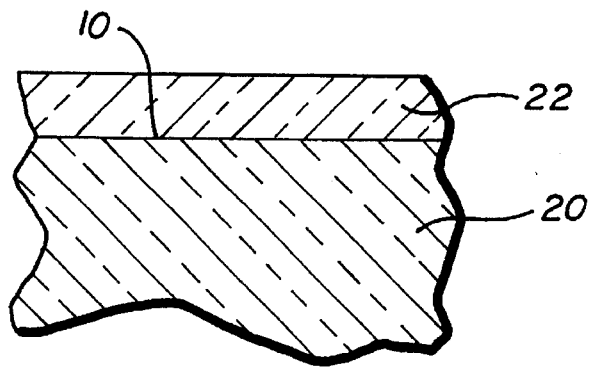

FIG. 2A depicts the structure resulting from the following sequence of events (the view taken along 1B—1B' is identical to the view taken along 1A—1A', and hence is not shown). First, a base oxide (not shown) is formed on the surface 10 of the semiconductor wafer. A deep p-well implant (about 300 keV) is done through the oxide layer, to form p-well region 20. An optional shallow p-well implant (about 120 keV) could then be done; this shallow implant is an alternative to the punchthrough ion implantation, described below. A similar sequence of steps is done to form the CMOS circuit n-well, which, since it is identical in all other respects to the p-well, is not shown here. The order of n-well and p-well formation is immaterial, since both sequences are masked.

A well-drive step is performed to cause diffusion of the dopants and to achieve the right junction depths. The oxide layer is next removed, such as by etching. A layer of polysilicon 22 is then deposited on the surface 10.

Figure 3A:
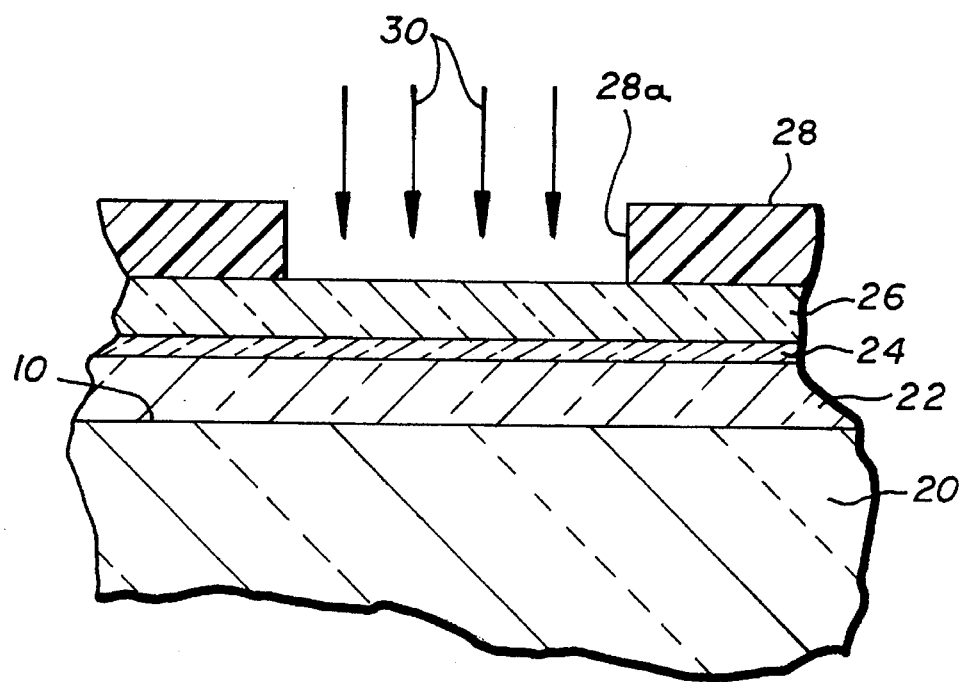

FIG. 3A depicts the structure resulting from the following sequence of events (the view taken along 1B—1B' is identical to the view taken along 1A—1A', and hence is not shown). A thin oxide layer 24 is formed on top of the polysilicon layer 22; this layer is formed to a thickness of about 100 to 200 Å. While this layer 24 is not essential, it should help relieve stress during subsequent steam oxidation. This oxide layer 24 is formed by a short oxidation. Next, a layer of silicon nitride 26 is deposited on the oxide layer 24; this layer is deposited to a thickness ranging from about 1,000 to 2,000 Å, preferably about 1,500 Å. The thickness of the nitride layer 26 depends on the thickness of the thin oxide layer 24 and defines standing wave patterns during the subsequent lithography step. The nitride layer 26 serves as a masking layer during the isolation trench etching and it also prevents decreasing the poly thickness by using the poly material during formation of an oxide layer over the top of the polysilicon layer 22 during subsequent steam oxidation. As shown in FIG. 3A, the n-LDD mask 12 comprising a patterned layer of photoresist 28 is formed on the surface of the silicon nitride layer 26, and phosphorus ions 30 are implanted through openings 28a formed therein by well-known processes into those portions of the polysilicon layer 22 underlying the openings. The phosphorus ions are implanted at a dose of about 1 to $2 \times 10^{15}$ cm$^{-2}$ at an energy of about 100 to 200 keV. For the channel of the CMOS transistor formed in the N well, the photoresist layer 28 is stripped, and a similar p-LDD mask 12, also comprising a patterned layer of photoresist (not shown) is deposited. Boron ions (not shown) are implanted through openings in the patterned photoresist layer into those portions of the polysilicon 22 underlying the openings, which are not shown in this set of Figures, but which are disposed adjacent the p-well regions. The boron ions are implanted at a dose of about 1 to $2 \times 10^{15}$ cm$^{-2}$ at an energy of about 40 to 80 keV. In either case, the polysilicon 22 is doped to a concentration ranging from about $1 \times 10^{18}$ to $1 \times 10^{18}$ to $1 \times 10^{19}$ cm$^{-3}$.

FIG. 4A depicts the structure resulting from the following sequence of events (the view taken along 1B—1B' is identical to the view taken along 1A—1A', and hence is not shown). The photoresist remaining from the p-LDD mask is removed. The trench mask 14 is next formed on the surface 10 of the semiconductor wafer, and etching is performed through the Si$_3$N$_4$ layer 26, the SiO$_2$ layer 24, through the poly layer 22, and into the silicon wafer below the surface 10, using conventional etching procedures. A trench, one sidewall of which is indicated at 29, is formed in the substrate, about 0.5 mm below the surface 10. The isolation trench surrounds each pair of adjoining wells. A steam oxidation is done next, at 40 minutes at 800° C., forming a film of SiO$_2$ 31 approximately 250 Å thick along the sidewalls and bottom of trench 29. The silicon dioxide film 31 is also formed on the sides of the polysilicon layer 22, and joins with the thin oxide layer 24 remaining beneath the Si$_3$N$_4$ layer 26.

Figure 5B:
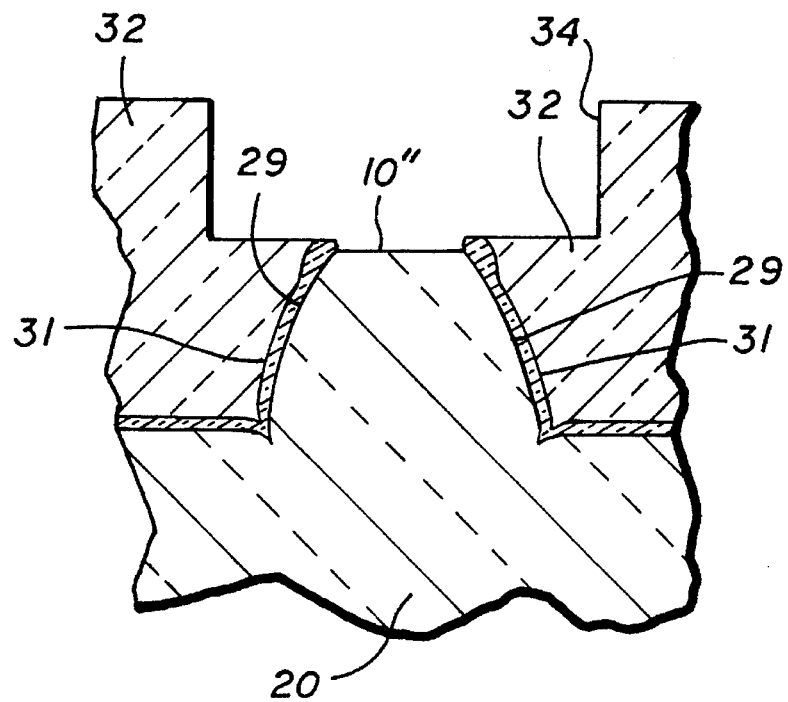

FIGS. 5A and 5B depict the structure resulting from the following sequence of events. The Si$_3$N$_4$ layer 26 is removed, using conventional processes, and a SiO$_2$ layer 32 is deposited, using the TEOS process. The TEOS layer is deposited everywhere, and fills in the trenches 29. A planarization mask (not shown) is deposited, and the TEOS layer 32 is planarized (i.e., polished) until the top surface 32' is about 4,500 Å above the substrate surface 10. The gate mask 16 is formed over the SiO$_2$ layer 32, and the exposed portions of the polysilicon layer 22 and SiO$_2$ layer 32 are etched to form openings 34 having a width of about 0.5 mm. These openings 34 will eventually define the gate channel of the device. The etching is done employing conventional processing. A choline clean step is then done to remove silicon which has a high amount of radiation damage. This damage is caused by plasma etching, and decreases carrier mobility in the channel inversion layer.

Figure 6A:
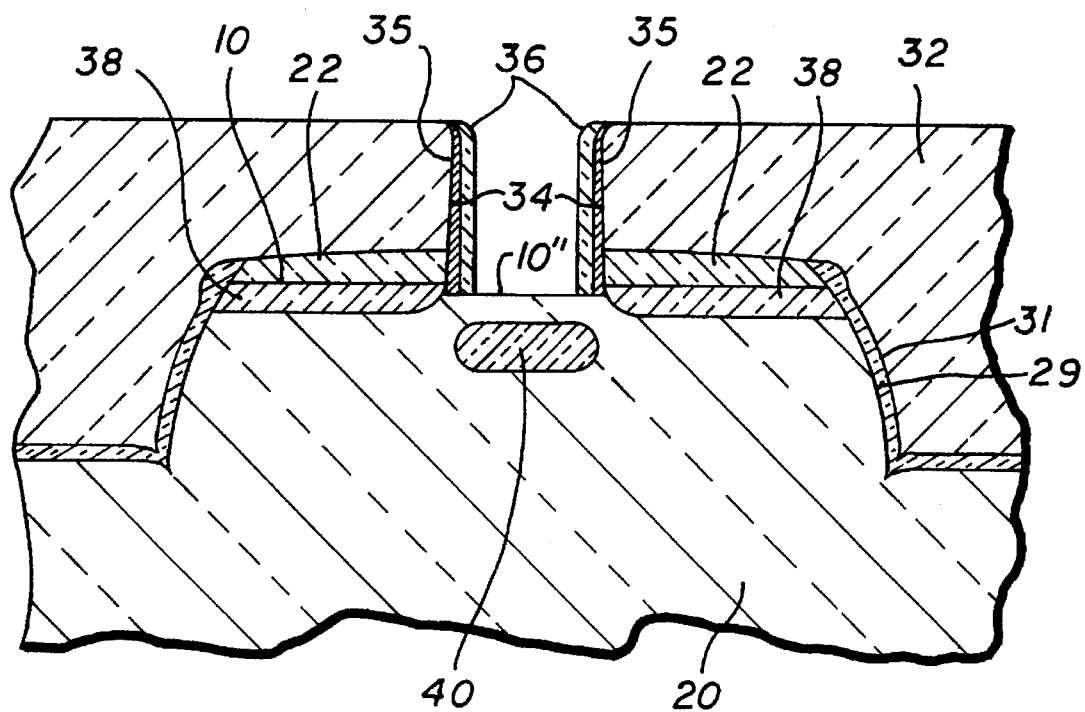

FIGS. 6A and 6B depict the structure resulting from the following sequence of events. Oxidation is done, using steam at 800° C. for 10 to 30 minutes, to form a very thin oxide layer 35, followed by deposition of an insulation layer 36 everywhere, including on the sides of the opening 34, on the thin oxide layer. The insulation layer is preferably made of Si$_3$N$_4$. The oxide layer 35 is very thin and is formed between oxide layer 32 and the Si$_3$N$_4$ insulation layer 36 and is done because deposition of silicon nitride onto silicon (which would happen if the oxide layer 35 were not present covering the polysilicon layer 22) causes high stress in the silicon, which results in crystal defects. The thickness of the insulation layer 36 ranges from about 300 to 1,000 Å, and preferably is about 400 Å. By varying the thickness of the insulation layer, the value of L$_{eff}$ (the effective channel length) of a transistor will change. For example, a nitride insulation layer having a thickness of about 400 Å results in an L$_{eff}$ of about 0.35 mm.

At this stage in the processing, there are a number of alternative steps. In one embodiment, where the optional shallow p-well/n-well implant layer is done, as described with regard to FIG. 2A, the LDD drive can be done, for example, in argon at 900° C. The final goal is to get the LDDs 38 under the gate, and this drive is required in order to drive the dopants from the doped poly layer 22. In another embodiment, if the optional shallow p-well implant is not done, as described with regard to FIG. 2A, then a punchthrough mask (not shown) is formed. For n-channel devices, boron ions at a dose of about 1 to $5 \times 10^{12}$ cm$^{-2}$ and an energy of 120 to 180 keV are implanted, and preferably at a dose of about $3 \times 10^{12}$ cm$^{-2}$ and an energy of about 150 keV, while for p-channel devices, phosphorus ions at a dose of about 1 to $5 \times 10^{12}$ cm$^{-2}$ and an energy of about 200 to 300 keV, and preferably at a dose of about $3 \times 10^{12}$ cm$^{-2}$ and an energy of about 200 keV, are implanted. LDD regions 38, shown here as n$^+$, are formed under the polysilicon layer 22, doped to a concentration ranging from about $1 \times 10^{18}$ cm$^{-3}$. The optional punchthrough region 40, of opposite conductivity than the LDD regions 38, here, p-type, is formed under the openings 34. Then, the insulation layer 36 is anisotropically etched, so that in the case of an $Si_3N_4$ insulation layer only nitride remains on the sidewalls of the openings 34.

FIGS. 7A and 7B depict the structure resulting from the following sequence of events. Following a pre-gate clean, employing conventional procedures, a gate oxide layer 42 is formed on the exposed substrate surface 10" at the bottom of the openings 34. This oxide layer 42 is formed by a technique known as grow-deposit-grow, and is formed to a thickness of about 90 to 100 Å. The grow-deposit-grow technique improves reliability, yet shortens the diffusion process and redistribution of dopant. The thickness range of about 90 to 100 Å provides optimized performance for $L_{actual}=0.5$ mm, where $L_{actual}$ is the actual gate length drawn on the mask. A polysilicon layer 44 is next blanket-deposited, employing conventional processes. The polysilicon layer 44 is deposited to a thickness ranging from about 500 to 1,000, and preferably about 750 Å±100 Å. The main objective of this layer 44 is to define the channel region and to protect the gate region during subsequent etching. Its thickness is related to the thickness of the $Si_3N_4$ layer 36 and drive times. Next, $V_t$ ion masks (not shown) are formed, and n-channel $V_t$ ion implantation is performed with boron ions at a dose of about 1 to $5 \times 10^{12}$ cm$^{-2}$ and an energy of about 25 to 40 keV, and preferably at a dose of about $4 \times 10^{12}$ cm$^{-2}$ and an energy of about 32 keV, while a p-channel $V_t$ ion implantation is performed with phosphorus ions at a dose of about 1 to $5 \times 10^{12}$ cm$^{-2}$ and an energy of about 50 to 90 keV, and preferably at a dose of about $3 \times 10^{12}$ cm$^{-2}$ and an energy of about 65 keV. These energies depend on the thickness of the poly layer 44. The $V_t$ implant region 46 is formed underneath the gate oxide 42, between the gate oxide and the punchthrough region 40. For n-channel devices, $V_t$ is p-type, while for p-channel devices, $V_t$ is n-type.

FIGS. 8A and 8B depict the structure resulting from the following sequence of events. The source/drain mask 18 is next formed, and the exposed regions in the polysilicon layer 44 and underlying $SiO_2$ layer 42 are etched to form source/drain openings 48 which expose the underlying polysilicon layer 22. A polysilicon layer 50 is deposited, filling the openings 34 and 48. The polysilicon layers 50 and 44 are polished and removed, leaving polysilicon plugs 50s, 50d in the source/drain openings 48, respectively, and polysilicon plug 50g in the gate opening 34. As a consequence of this processing, the source/drain plugs 50s, 50d are self-aligned to each other and to the gate plug 50g.

FIG. 9A depicts the structure resulting from the following sequence of events. $n^+$ and $p^+$ masks (not shown) are formed, and $n^+$ and $p^+$ ions are blanket-implanted, using high doses (about $5 \times 10^{15}$ to $1 \times 10^{16}$ cm$^{-2}$ in both instances) and low energies (about 20 to 50 keV in both instances). The in, planted ions cannot reach silicon through the $SiO_2$ layer 42, but they can diffuse fast along the grain boundaries in the polysilicon layers 22, 50s, 50d. An implant anneal and drive is then done, typically in argon, for 90 minutes at 900° C., to form heavily doped source and drain regions 39 and gate plug 50g, leaving the lightly doped source and drain regions 38 adjacent along the shallow channel doping region 46. The amount of dopant driven out of the polysilicon into silicon governs the time and temperature of annealing. The drive cycle should not be so long as to jeopardize already-formed channel regions. The heavily doped regions 39 are doped to a concentration ranging from about $1 \times 10^{20}$ to $1 \times 10^{21}$ cm$^{-3}$.

Ohmic electrical connections (not shown) are then made to the source/drain polysilicon plugs 50s, 50d and to the gate polysilicon plugs 50g. Techniques for forming such electrical connections are conventional.

The polysilicon layer 22 is thick enough to ensure that during subsequent mask etching processes, the TEOS layer 32 will not be etched into the trench 29. The advantage of this invention is that dopant redistribution in the trench sidewalls is avoided as well as the problems in prior trench designs as described above. Thinning of the gate oxide 42 at the trench corners is also avoided, which means a uniform punchthrough voltage, $V_{pt}$, for transistors.

Figure 10:
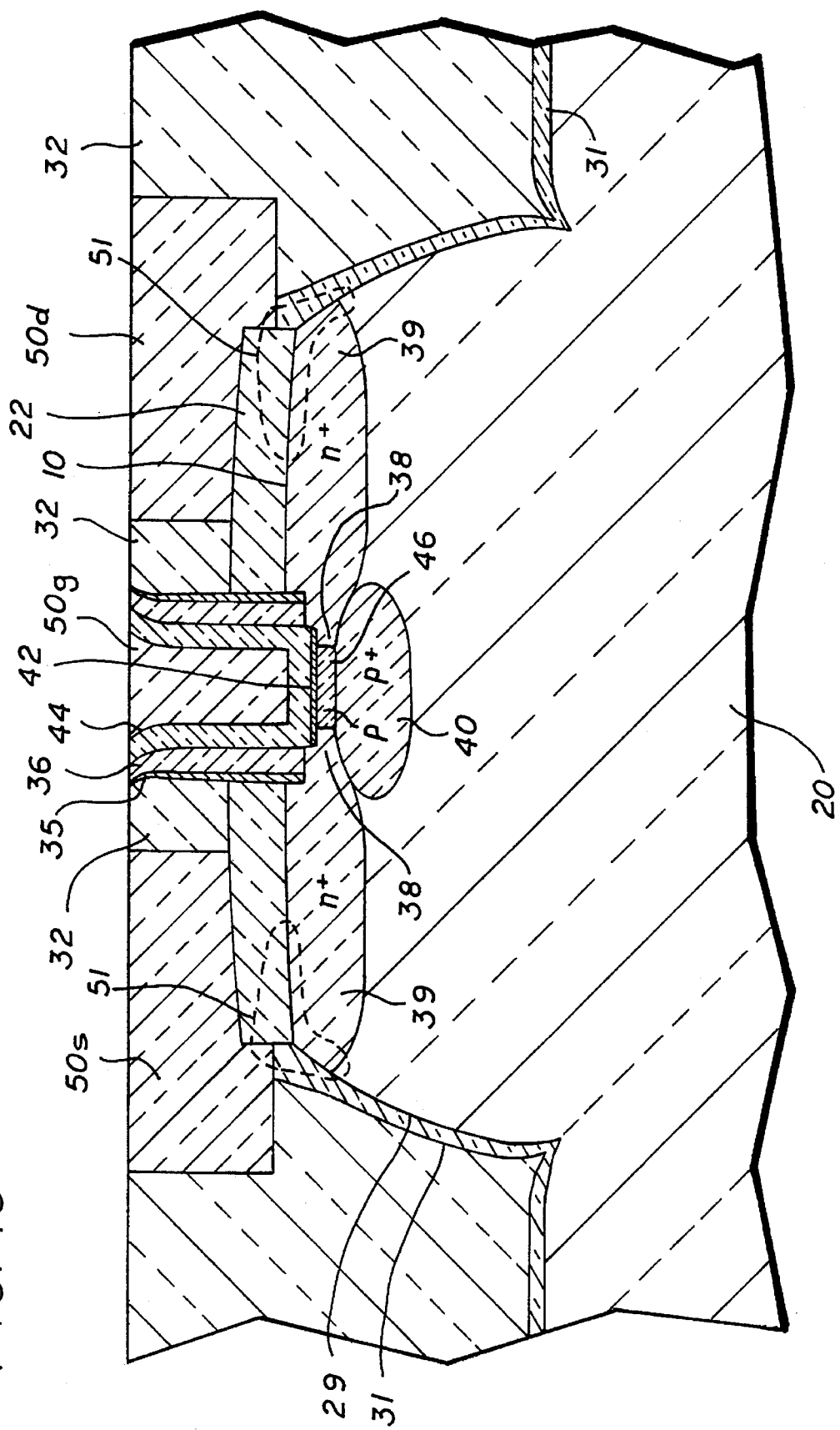
FIG. 10 is an enlarged cross-sectional view, depicting the details of the final device, prior to the formation of interconnections, also taken along 1A—1A' of FIG. 1.

FIG. 10 shows the preferred device, with a shallow $V_{th}$ ion implant region 46 under the gate oxide 42 and a deeper punchthrough ion implant region 40 under the $V_{th}$ region. LDD regions 38, which extend under the gate 50g, are contacted by polysilicon LDDs 22 and are self-aligned thereto. The portion of the device portrayed in FIG. 10 that is particularly benefited by the presence of the doped polysilicon layers 22 is outlined by dashed lines 51. Without the protection of the doped polysilicon layers 22, this portion 51 might be exposed by subsequent etching operations. The exposed Si surface would form part of the gate region and cause (1) degraded carrier mobility in the mechanically-stressed curved region with lower saturation current, and (2) an accumulation of dopant near the exposed Si surface which would result in spatial variations of threshold voltage.

There is one major concern regarding the manufacturability, namely, polysilicon etch at gate mask. The overetch time must be long enough to account for polysilicon thickness variations. It is advisable to keep the gate opening as shallow as possible.

By using punchthrough implants, an incredible control can be obtained over short channel effects (even for $L_{eff} >> 0.25$ mm) and a very high barrier between source and drain (in simulations, the DIBL effect does not exist).

Good results were also obtained with blanket implant at well masks, with DIBL of less than 20 mV/V (using punchthrough implant, these numbers are >>5 mV/V). By using blanket implants, two masking layers can be saved, and the final number of masking steps of the process of the invention is one less than that of the Haskell device. Even without the punchthrough stop implant, the punchthrough voltages of the device are very high (better than conventional specifications). By using the punchthrough stop implant obtained, device characteristics resemble those from SOI (silicon-on-insulator) devices; they are superior to any reported on bulk silicon.

Summarizing (assuming process parameter within the given ranges):

gate oxide: 9±0.5 nm.

gate critical dimension: 0.5±0.05 mm.

gate trench (caused by polysilicon non-uniformity across the wafer): 75±25 nm.

spacer width: 40±10 nm.

source/drain mask critical dimension: 0.8±0.08 nm.

Device parameter distribution for a normal large scale production from statistical simulations:

$V_t$=0.43±0.014V; 57% variations are coming from gate oxide thickness variations, and 25% are coming from gate critical dimension variations.

$L_{ds,sat}$=793±61 mA/mm; 34% variations are coming from gate trench variations, and 24% are coming from gate critical dimension variations, while 21% are coming from variation in source/drain resistances.

Saturated transconductance: 377±20 mS/mm; 44% variations are coming from gate trench variations, 19% from variation in source/drain resistances, and 18% from gate critical dimension variations.

The major features provided by the process of the invention include:
  (a) 0.5 mm lithography gate mask will create a >>0.35 mm transistor. The gate oxide actual length is controlled by oxide and insulation spacers.
  (b) Device performances are also governed by thin polysilicon layer 44 thickness. The poly thickness will change the effective length. The implant only goes into the channel region, because $V_{th}$ ion implantation is masked by polysilicon 44 on sidewalls.
  (c) Self-alignment of source, gate and drain is preserved by the pre-doped polysilicon layers.

INDUSTRIAL APPLICABILITY

The present invention is expected to find use in the fabrication of CMOS devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the an to understand the invention for various embodiments and with various modifications as are suited to the particular use contemplated. It is intended that the scope of the invention be defined by the claims appended hereto and their equivalents.

What is claimed is:

1. A short channel metal-oxide semiconductor device in a semiconductor substrate separated from neighboring devices wherein trenches are formed in said substrate to define each device, said trenches having sidewalls lined with an oxide liner and filled with an oxide filler, wherein said device includes lightly doped source and drain regions and heavily doped source and drain regions having a first conductivity separated by a gate region; a shallow channel doping region having a second conductivity opposite to said first conductivity formed in said gate region; a gate oxide formed over said gate region; a gate electrode comprising doped polysilicon of said first conductivity, said gate electrode having a horizontal portion and vertical portions, said horizontal portion contacting said gate oxide and said vertical portions extending from said horizontal portion; and doped polysilicon source and drain contacts, said polysilicon source and drain contacts separated from said horizontal portion of said gate electrode by oxide regions; said short channel metal-oxide semiconductor device fabricated by a method comprising:

(a) depositing doped polysilicon layers atop and in contact with said source and drain regions, said polysilicon layers extending beneath said oxide regions and said doped polysilicon source and drain contacts and abutting said oxide liner, said doped polysilicon layers preventing said oxide filler from being overetched to the point of exposing said trench sidewalls during subsequent process steps, thereby preventing the formation of parasitic devices in said sidewalls; and
  (b) depositing vertical insulation spacers to separate said gate electrode from said oxide regions, wherein said method increases the drive currents attainable by said device.

2. A short channel metal-oxide semiconductor device separated from neighboring devices by a trench whose side-walls are lined with an oxide liner, said trench filled with an oxide filler, said device comprising:

(a) lightly doped source and drain regions and heavily doped source and drain regions having a first conductivity separated by a gate region;
  (b) a shallow channel doping region having a second conductivity opposite to said first conductivity formed in said gate region;
  (c) a gate oxide formed over said gate region;
  (d) doped polysilicon layers atop and in contact with each of said source and drain regions;
  (e) doped polysilicon source and drain contacts atop and in contact with each of said doped polysilicon layers;
  (f) a gate electrode comprising doped polysilicon of said first conductivity, said gate electrode having a horizontal portion and vertical portions, said horizontal portion contacting said gate oxide and said vertical portions extending from said horizontal portion; said doped polysilicon source and drain contacts separated from said horizontal portion of said gate electrode by oxide regions; and
  (g) vertical insulation spacers separating said gate electrode from said oxide regions, wherein said doped polysilicon layers extend beneath said oxide regions and said polysilicon source and drain contacts and abut said oxide liners of said trench sidewalls, said doped polysilicon layers preventing said oxide filler from being overetched to the point of exposing said trench sidewalls in subsequent process steps.

3. The device of claim 2 further including a deep implant of the same conductivity as said shallow channel doping region, said deep implant formed beneath said shallow channel doping region and contacting said source and drain regions.

4. The device of claim 2 wherein said vertical insulation spacers comprise a nitride.

5. The device of claim 2 wherein said vertical insulation spacers have a thickness ranging from about 300 to 1,000 Å.

6. The device of claim 2 wherein said vertical insulation spacers are separated from said oxide regions by a thin oxide spacer.

7. The device of claim 2 wherein the portion of said doped polysilicon layers in contact with said lightly doped source and drain regions is doped to a concentration ranging from about $1\times10^{18}$ to $1\times10^{19}$ cm$^{-3}$.

8. The device of claim 2 wherein said lightly doped source and drain regions are doped to a concentration ranging from about $1\times10^{18}$ to $1\times10^{19}$ cm$^{-3}$.

9. The device of claim 2 wherein said heavily doped source and drain regions are doped to a concentration ranging from about $1\times10^{20}$ to $1\times10^{21}$ cm$^{-3}$.

* * * * *